United States Patent
Hu

(10) Patent No.: US 9,798,207 B2
(45) Date of Patent: Oct. 24, 2017

(54) MANUFACUTRIG METHOD OF ARRAY SUBSTRATES, ARRAY SUBSTRATES, AND DISPLAY PANELS

(71) Applicant: Shenzhen China Star Optoelectronics Technology Co., Ltd., Shenzhen, Guangdong (CN)

(72) Inventor: Yutong Hu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 245 days.

(21) Appl. No.: 14/438,225

(22) PCT Filed: Feb. 10, 2015

(86) PCT No.: PCT/CN2015/072643
§ 371 (c)(1),
(2) Date: Apr. 23, 2015

(87) PCT Pub. No.: WO2016/112572
PCT Pub. Date: Jul. 21, 2016

(65) Prior Publication Data
US 2016/0349554 A1 Dec. 1, 2016

(30) Foreign Application Priority Data
Jan. 13, 2015 (CN) .......................... 2015 1 0016748

(51) Int. Cl.
*G02F 1/1368* (2006.01)
*H01L 33/08* (2010.01)
(Continued)

(52) U.S. Cl.
CPC ........ *G02F 1/1368* (2013.01); *G02F 1/13439* (2013.01); *G02F 1/133514* (2013.01);
(Continued)

(58) Field of Classification Search
CPC ............. G02F 1/1368; G02F 1/133514; G02F 1/13439; G02F 1/136227; G02F 2201/123;
(Continued)

(56) References Cited

U.S. PATENT DOCUMENTS 8,420,970 B2 4/2013 Huang et al.
8,742,425 B2 6/2014 Kim
(Continued)

*Primary Examiner* — Nathanael R Briggs
(74) *Attorney, Agent, or Firm* — Andrew C. Cheng

(57) ABSTRACT

A manufacturing method of array substrates, an array substrate, and a display panel are disclosed. The manufacturing method of the array substrate includes: forming a first electrode and a gate electrode on a substrate in sequence; forming an insulation layer, a semiconductor layer and a dielectric layer on the substrates in sequence and forming a first through hole, a second through hole and a third through hole; forming a source electrode, a drain electrode, a second electrode and a third electrode on the dielectric layer, wherein the source electrode and the drain electrode connect to the semiconductor layer respectively, the second electrode connects to the first electrode and the third electrode connects with the drain electrode. In this way, the number of the masks needed during the manufacturing process is decreased. In addition, the manufacturing process is simplified and the cost is reduced.

8 Claims, 6 Drawing Sheets

(51) Int. Cl.
*G02F 1/1335* (2006.01)
*G02F 1/1343* (2006.01)
*G02F 1/1362* (2006.01)
*H01L 21/02* (2006.01)
*H01L 21/027* (2006.01)
*H01L 21/3213* (2006.01)
*H01L 27/12* (2006.01)
*H01L 29/45* (2006.01)
*H01L 29/66* (2006.01)
*H01L 29/786* (2006.01)
*H01L 21/28* (2006.01)

(52) U.S. Cl.
CPC .... *G02F 1/136227* (2013.01); *H01L 21/0274* (2013.01); *H01L 21/02532* (2013.01); *H01L 21/02592* (2013.01); *H01L 21/02667* (2013.01); *H01L 21/28008* (2013.01); *H01L 21/32133* (2013.01); *H01L 27/1222* (2013.01); *H01L 27/1274* (2013.01); *H01L 29/458* (2013.01); *H01L 29/66765* (2013.01); *H01L 29/78678* (2013.01); *H01L 33/08* (2013.01); *G02F 2201/123* (2013.01); *G02F 2202/104* (2013.01)

(58) Field of Classification Search
CPC ......... G02F 2202/104; H01L 21/02532; H01L 21/02592; H01L 21/02667; H01L 21/0274; H01L 21/28008; H01L 21/32133; H01L 27/1222; H01L 27/1274; H01L 29/458; H01L 29/66765; H01L 29/78678; H01L 33/08
See application file for complete search history.

(56) References Cited

U.S. PATENT DOCUMENTS

| | | |
|---|---|---|
| 8,803,019 B2 | 8/2014 | Huang et al. |
| 2008/0049155 A1* | 2/2008 | Yagi .................. G02F 1/136259 349/39 |
| 2009/0085040 A1 | 4/2009 | Ahn |
| 2011/0242444 A1 | 10/2011 | Song |
| 2011/0309362 A1* | 12/2011 | Yoon .................. G02F 1/136213 257/59 |
| 2012/0104397 A1 | 5/2012 | Choi |
| 2013/0015449 A1 | 1/2013 | Lee |
| 2013/0112975 A1 | 5/2013 | Choi |
| 2016/0240687 A1 | 8/2016 | Hu |

* cited by examiner

ND OF THE INVENTION# MANUFACUTRIG METHOD OF ARRAY SUBSTRATES, ARRAY SUBSTRATES, AND DISPLAY PANELS

BACKGROUND OF THE INVENTION

1. Field of the Invention

The present disclosure relates to display technology, and more particularly to a manufacturing method of array substrates, an array substrate, and a display panel.

2. Discussion of the Related Art

During the packaging process of Low Temperature Poly-silicon (LTPS) thin film transistor liquid crystal devices (TFT-LCDs), usually, excimer laser is adopted as a heat source. After passing through a projection system, laser may generate laser beams with uniform energy for projecting on the a-Si glass substrate. After absorbing the energy from the excimer laser, the a-Si glass substrate transforms into the poly-silicon. The temperature of the overall process is under 600° C., and thus may be applied to all of the glass substrates.

There are a variety of structures of conventional bottom-gate LTPS. Thus, the manufacturing process is more complicated, and may need a great number of masks, which increases the manufacturing cost. For instance, the conventional PMOS manufacturing process needs at least nine masks.

In addition, an organic layer may be adopted within the conventional bottom-gate LTPS for isolating metallic electrode and transparent electrode, which may decrease the parasitic capacitance therebetween. The great thickness of the organic layer often results in a critical requirement for the manufacturing process. In addition, the thickness may results in non-uniform brightness issue, and results in a low yield rate.

SUMMARY

According to the present disclosure, a manufacturing method of array substrates, an array substrate, and a display panel may decrease the number of the masks during the manufacturing process, which simplifies the manufacturing process and reduces the cost.

In one aspect, a manufacturing method of array substrates includes:

forming a first electrode and a gate electrode on a substrate in sequence, a transparent conductive film is provided between the gate electrode and the substrate, and the transparent conductive film and the first electrode are formed within the same manufacturing step; forming an insulation layer on the substrate, and the insulation layer covers the gate electrode and the first electrode; forming a semiconductor layer on the insulation layer; forming a dielectric layer on the semiconductor layer, and forming a first through hole and a second through hole in a location corresponding to the semiconductor layer such that a portion of the semiconductor layer are exposed via the first through hole and the second through hole, forming a third through hole in the location corresponding to the gate electrode such that the gate electrode is exposed via the third through hole; forming a source electrode, a drain electrode and a second electrode on the dielectric layer, the source electrode and the drain electrode connect to the semiconductor layer respectively via the first through hole and the second through hole, and the second electrode connects to the first electrode via the third through hole to form a storage capacitor; forming a transparent third electrode on the dielectric layer, and the third electrode connects with the drain electrode to form at least one pixel electrode; wherein the gate electrode, the source electrode, the drain electrode, and the second electrode are metallic electrodes, and the first electrode and the third electrode are ITO.

Wherein the step of forming the first electrode and the gate electrode further includes: forming a transparent first electrode layer on the substrate; forming a gate electrode layer on the first electrode layer; patterning the first electrode layer and the gate electrode layer so as to form a first island and a second island, and each of the islands comprises the first electrode layer and the gate electrode layer; and etching the first island and the second island to respectively form the gate electrode and the first electrode.

Wherein the step of forming the semiconductor layer on the insulation layer further includes: depositing an a-Si layer on the insulation layer to obtain poly-silicon; covering a photoresist layer over the poly-silicon; irradiating the substrate such that a portion of the photoresist layer that has not been blocked by the gate electrode is exposed; etching the exposed portion of the photoresist layer and the poly-silicon; doping the poly-silicon to form a first doped area and a second doped area for respectively connecting the source electrode and the drain electrode, the first doped area corresponds to the first through hole and the second doped area corresponds to the second through hole.

In another aspect, an array substrate includes: a substrate, and a first electrode layer, an insulation layer, a semiconductor layer, a dielectric layer, and a second electrode layer disposed on the substrate in sequence; the first electrode layer comprises the gate electrode and the first electrode, a transparent conductive film is provided between the gate electrode and the substrate, and the transparent conductive film and the first electrode are formed within the same manufacturing step; the second electrode includes a source electrode, a drain electrode, a second electrode, and a transparent third electrode; the semiconductor layer respectively connects to the source electrode and the drain electrode via a first through hole and a second through hole being arranged on the dielectric layer in accordance with the semiconductor layer; a third through hole being arranged on the dielectric layer and the insulation layer in accordance with the first electrode such that the first electrode connects with the second electrode to form a storage capacitor; and the third electrode connects with the drain electrode to form at least one pixel electrode.

Wherein the semiconductor layer is made by doping poly-silicon so as to form a first doped area and a second doped area; and the first doped area and the second doped area connect to the source electrode and the drain electrode respectively via the first through hole and the second through hole.

Wherein the gate electrode, the source electrode, the drain electrode, and the second electrode are metallic electrodes.

Wherein the first electrode and the third electrode are ITO.

In another aspect, a display panel includes: a color film substrate, an array substrate, and a liquid crystal layer between the color film substrate and the array substrate, wherein the array substrate comprises a substrate, and a first electrode layer, an insulation layer, a semiconductor layer, a dielectric layer, and a second electrode layer disposed on the substrate in sequence; the first electrode layer comprises the gate electrode and the first electrode, a transparent conductive film is provided between the gate electrode and the substrate, and the transparent conductive film and the first electrode are formed within the same manufacturing step; the second electrode includes a source electrode, a drain electrode, a second electrode, and a transparent third electrode; the semiconductor layer respectively connects to the source electrode and the drain electrode via a first through hole and a second through hole being arranged on the dielectric layer in accordance with the semiconductor layer; a third through hole being arranged on the dielectric layer and the insulation layer in accordance with the first electrode such that the first electrode connects with the second electrode to form a storage capacitor; and the third electrode connects with the drain electrode to form at least one pixel electrode.

Wherein the semiconductor layer is made by doping poly-silicon so as to form a first doped area and a second doped area; and the first doped area and the second doped area connect to the source electrode and the drain electrode respectively via the first through hole and the second through hole.

Wherein the gate electrode, the source electrode, the drain electrode, and the second electrode are metallic electrodes.

Wherein the first electrode and the third electrode are ITO.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

DETAILED DESCRIPTION OF THE EMBODIMENTS

Embodiments of the invention will now be described more fully hereinafter with reference to the accompanying drawings, in which embodiments of the invention are shown.

Figure 1:
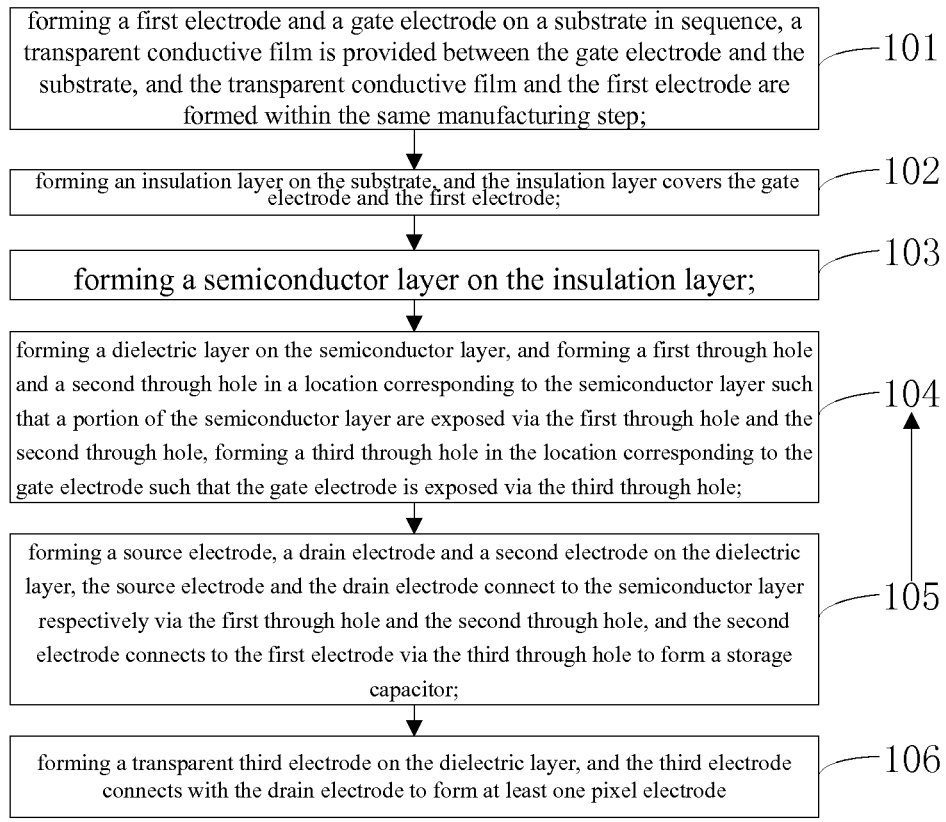
FIG. 1 is a flowchart illustrating the manufacturing method of the array substrate in accordance with a first embodiment.

FIG. 1 is a flowchart illustrating the manufacturing method of the array substrate in accordance with a first embodiment. The manufacturing method includes the following steps.

In step 101, a first electrode 203 and a gate electrode 202 are formed on a substrate 201 in sequence. A transparent conductive film 2021 is provided between the gate electrode 202 and the substrate 201. The transparent conductive film 2021 and the first electrode 203 are formed within the same manufacturing step.

Figure 2:
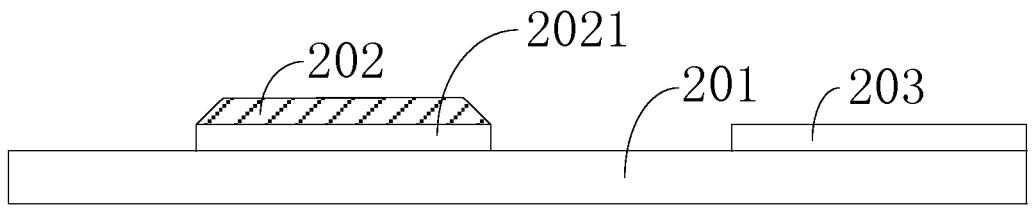
FIG. 2 is a schematic view of the array substrate with respect to step 101 of FIG. 1.

As shown in FIG. 2, the substrate 201 is made by glasses. After the glass substrate 201 is cleaned and dried, the transparent conductive film 2021 and the metallic layer are formed on the glass substrate 201 in sequence. Afterward, a pattern process is applied such that the transparent conductive layer forms the first electrode 203 and the metallic layer forms the gate electrode 202.

The gate may be made by one of the Pt, Ru, Au, Ag, Mo, Cr, Al, Ta, Ti or W or a plurality of alloy. The gate electrode 202 is for connecting gate lines. The transparent conductive film may be ITO, AZO, and so on.

At this moment, a first mask is adopted when the pattern process is applied to the gate electrode 202 and the first electrode 203.

In step 102, an insulation layer 204 is formed above the glass substrate 201. The insulation layer 204 covers the gate electrode 202 and the first electrode 203.

Figure 3:
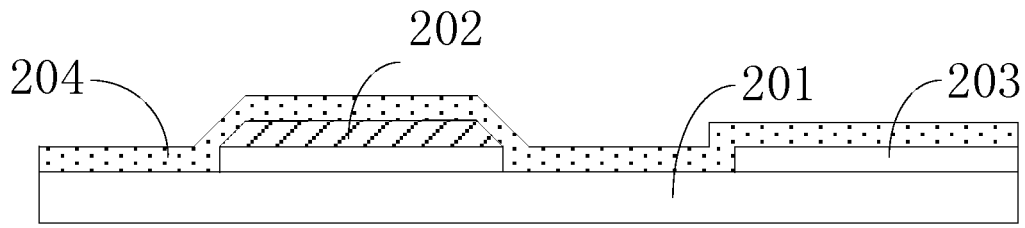
FIG. 3 is a schematic view of the array substrate with respect to step 102 of FIG. 1.

As shown in FIG. 3, the insulation layer 204 may be SiOx or SiNx. In another example, the insulation layer 204 may be formed by overlapping the SiOx and the SiNx. The insulation layer 204 is formed on the glass substrate 201 mainly via the chemical vapor deposition (CVD), and the insulation layer 204 covers the gate electrode 202 and the first electrode 203 so as to provide the insulation effect.

At this moment, a second mask is adopted when the pattern process is applied to the insulation layer 204.

In step 103, a semiconductor layer 205 is formed on the insulation layer 204.

Figure 4:
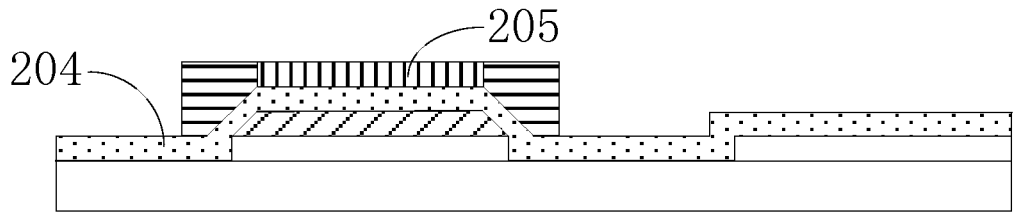
FIG. 4 is a schematic view of the array substrate with respect to step 103 of FIG. 1.

As shown in FIG. 4, the semiconductor layer 205 may be P-MOS, N-MOS, or C-MOS.

At this moment, a third mask is adopted when the pattern process is applied to the semiconductor layer 205.

In step 104, a dielectric layer 206 is formed on the semiconductor layer 205. A first through hole 2061 and a second through hole 2062 are formed in a location corresponding to the semiconductor layer 205 such that a portion of the semiconductor layer 205 are exposed via the first through hole 2061 and the second through hole 2062. A third through hole 2063 is formed in the location corresponding to the first electrode 203 such that the first electrode 203 is exposed via the third through hole 2063.

Figure 5:
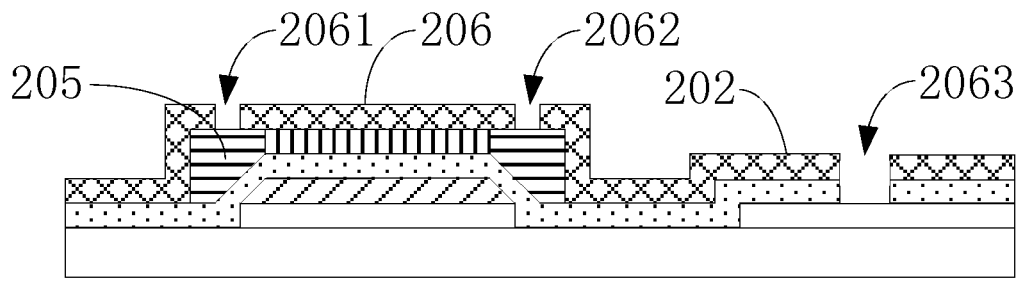
FIG. 5 is a schematic view of the array substrate with respect to step 104 of FIG. 1.
Figure 6:
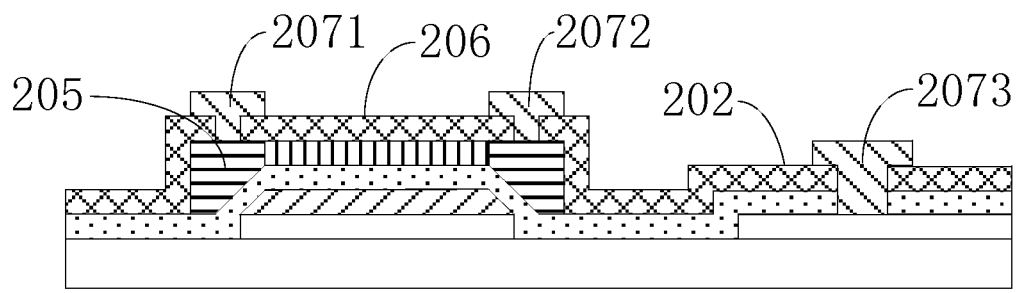
FIG. 6 is a schematic view of the array substrate with respect to step 105 of FIG. 1.
Figure 7:
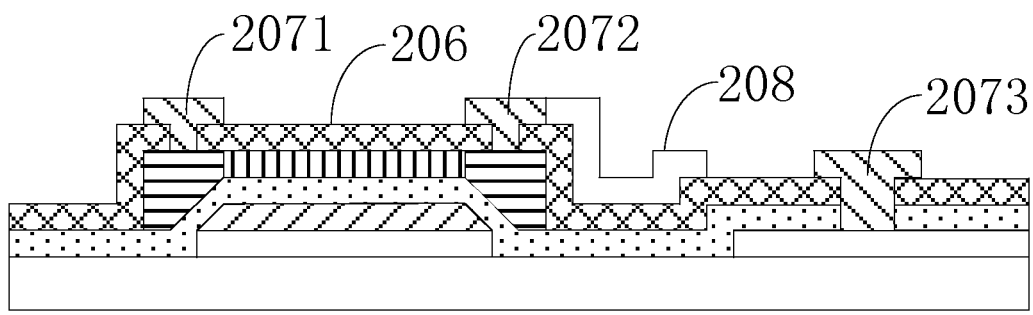
FIG. 7 is a schematic view of the array substrate with respect to step 106 of FIG. 1.

As shown in FIG. 5, the dielectric layer 206 is made by ILD (interlayer dielectrics) so as to isolate the dielectric layer 206 and the subsequent electrodes.

At this moment, a fourth mask is adopted during the formation of the through holes on the dielectric layer 206.

In step 105, a source electrode 2071, a drain electrode 2072, and a second electrode 2073 are formed on the dielectric layer 206. The source electrode 2071 and the drain electrode 2072 connect to the semiconductor layer 205 respectively via the first through hole 2061 and the second through hole 2062. The second electrode 2073 connects to the first electrode 203 via the third through hole 2063 to form a storage capacitor.

The source electrode 2071, the drain electrode 2072, and the second electrode 2073 may be made by one of the Pt, Ru, Au, Ag, Mo, Cr, Al, Ta, Ti or W or a plurality of alloy via coating.

At this moment, a fifth mask is adopted when the source electrode 2071, the drain electrode 2072, and the second electrode 2073 are patterned.

In step 106, a transparent third electrode 208 is formed on the dielectric layer 206. The third electrode 208 connects with the drain electrode 2072 to form at least one pixel electrode.

The third electrode 208 is made by the same material with the gate electrode 202. In an example, the third electrode 208 may be made by ITO or AZO.

At this moment, a sixth mask is adopted when the third electrode 208 is patterned.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

Figure 8:
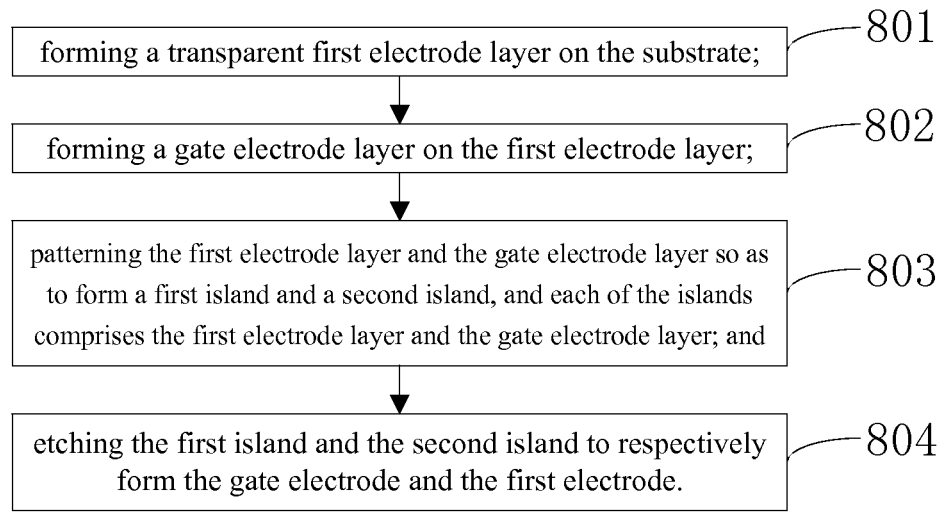
FIG. 8 is a flowchart illustrating the manufacturing method of the array substrate in accordance with a second embodiment.

FIG. 8 is a flowchart illustrating the manufacturing method of the array substrate in accordance with a second embodiment.

In step 801, a first electrode layer 203 is formed on the glass substrate 201.

Figure 9:
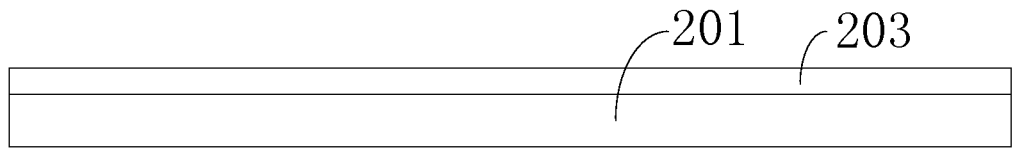
FIG. 9 is a schematic view of the array substrate with respect to step 801 of FIG. 8.

As shown in FIG. 9, the first electrode 203 is a transparent conductive film, such as ITO or AZO.

In step 802, a gate electrode layer 202 is formed on the first electrode 203.

Figure 10:
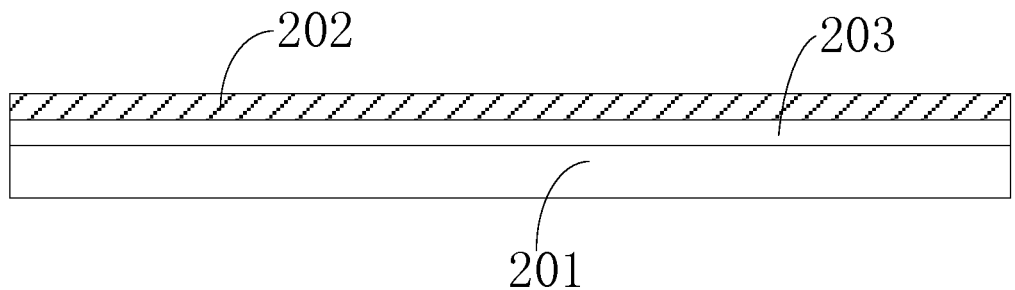
FIG. 10 is a schematic view of the array substrate with respect to step 802 of FIG. 8.

As shown in FIG. 10, the gate electrode 202 is formed by one of Pt, Ru, Au, Ag, Mo, Cr, Al, Ta, Ti or W or a plurality of alloy.

In step 803, the first electrode layer 203 and the gate electrode layer 202 are patterned so as to form a first island 210 and a second island 220. Each of the islands includes the first electrode layer 203 and the gate electrode layer 202.

Figure 11:
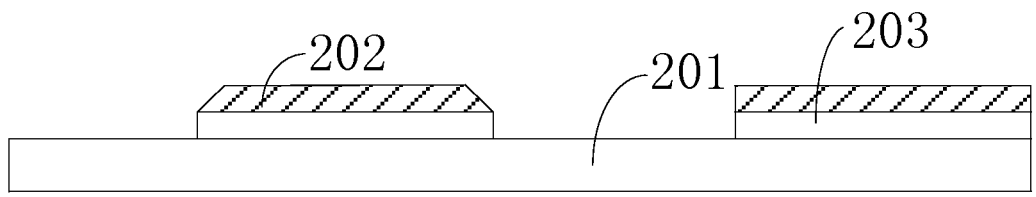
FIG. 11 is a schematic view of the array substrate with respect to step 803 of FIG. 8.

As shown in FIG. 11, a mask is adopted when the first electrode 203 and the gate electrode 202 are patterned.

In step 804, the first island 210 and the second island 220 are etched to respectively form the gate electrode 202 and the first electrode 203.

Figure 12:
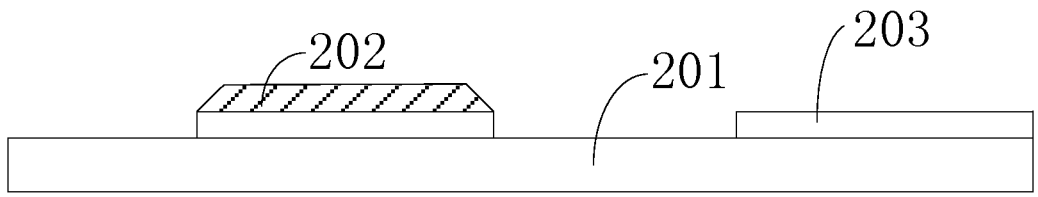
FIG. 12 is a schematic view of the array substrate with respect to step 804 of FIG. 8.

As shown in FIG. 12, a transparent conductive film exists between the etched gate electrode 202 and the glass substrate 201, but the metallic layer above the first electrode 203 has been etched away.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

Figure 13:
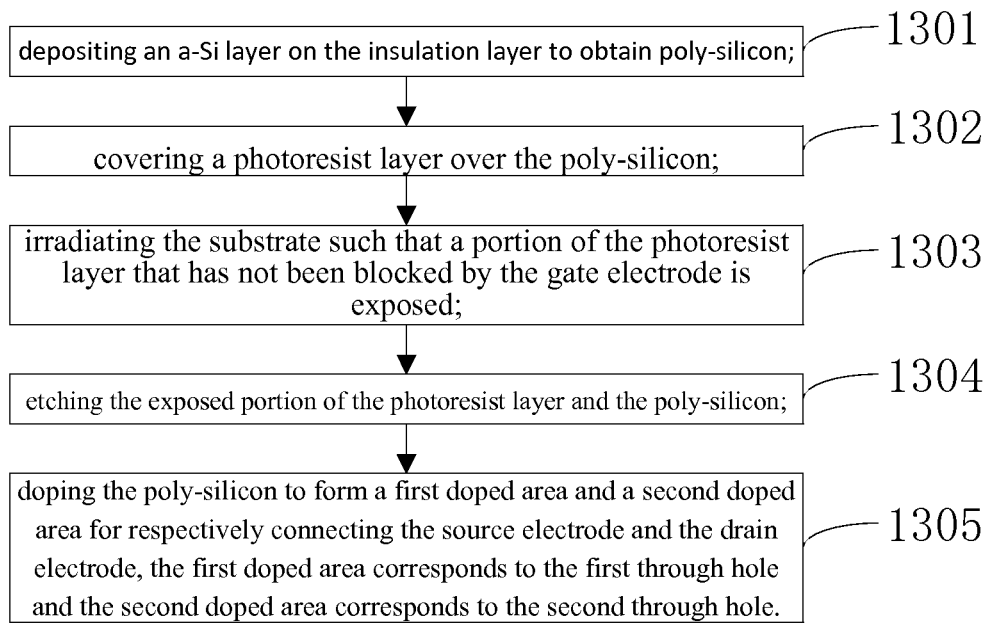
FIG. 13 is a flowchart illustrating the manufacturing method of the array substrate in accordance with a third embodiment.

FIG. 13 is a flowchart illustrating the manufacturing method of the array substrate in accordance with a third embodiment. The method includes the following steps.

In step 1301, a a-Si layer is deposited on the insulation layer 204 to obtain poly-silicon 211.

Figure 14:
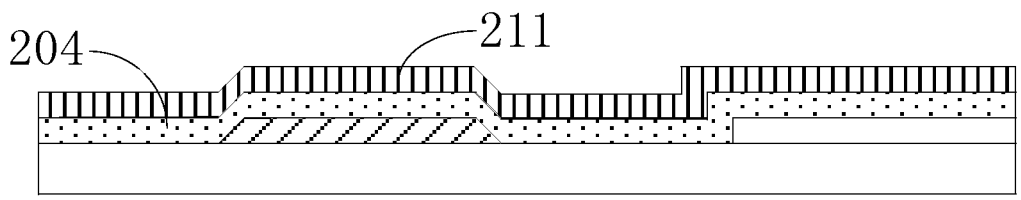
FIG. 14 is a schematic view of the array substrate with respect to step 1301 of FIG. 13.

As shown in FIG. 14, the a-Si layer is deposited on the insulation layer 204. In addition, excimer laser is adopted as a heat source. After passing through a projection system, laser may generate laser beams with uniform energy for projecting on the a-Si layer. After absorbing the energy from the excimer laser, the a-Si layer transforms into the poly-silicon 211. The temperature of the overall process is under 600° C.

In step 1302, a photoresist layer 212 covers the poly-silicon 211.

Figure 15:
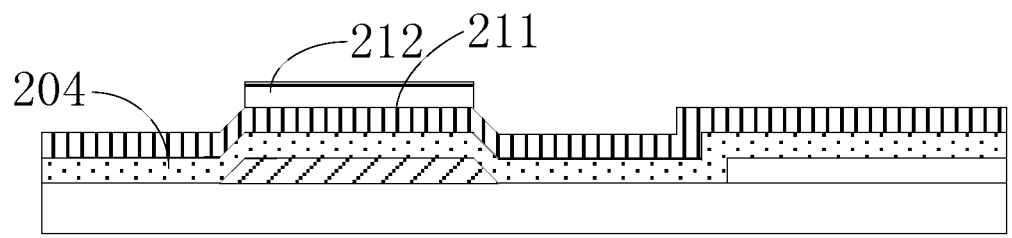
FIG. 15 is a schematic view of the array substrate with respect to step 1302 of FIG. 13.

As shown in FIG. 15, the photoresist layer 212 is negative photo-resist.

In step 1303, the substrate is irradiated such that a portion of the photoresist layer 212 that has not been blocked by the gate electrode 202 is exposed.

In step 1304, the exposed portion of the photoresist layer 212 and the poly-silicon 211 are etched.

Figure 16:
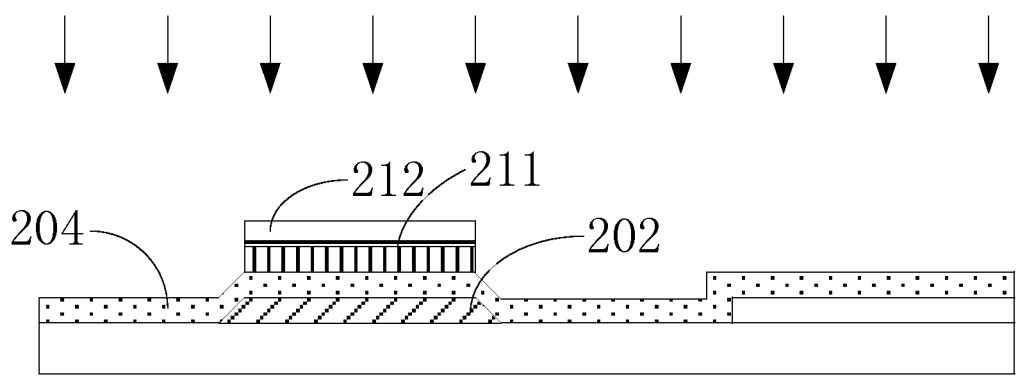
FIG. 16 is a schematic view of the array substrate with respect to step 1303 and step 804 of FIG. 12.

As shown in FIG. 16, due to blocking of the gate electrode 202, the photoresist layer 212 corresponding to the gate electrode 202 is prevented from being exposed, and the exposed portion of the photoresist layer 212 and the poly-silicon 211 are etched.

In step 1305, the poly-silicon 211 is doped to form a first doped area 213 and a second doped area 214 for respectively connecting the source electrode and the drain electrode. The first doped area 213 corresponds to the first through hole and the second doped area 214 corresponds to the second through hole.

Figure 17:
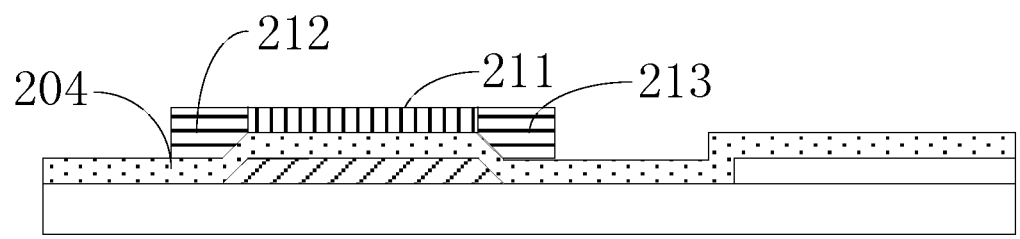
FIG. 17 is a schematic view of the array substrate with respect to step 1305 of FIG. 13.

As shown in FIG. 17, the doping may be P+doping or N+doping such that the semiconductor layer may be P-MOS, N-MOS, or C-MOS structure.

The above steps only relate to step 103 of the first embodiment. The second embodiment also includes other steps that may be executed before or after step 103 as disclosed in the first embodiment.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

Figure 18:
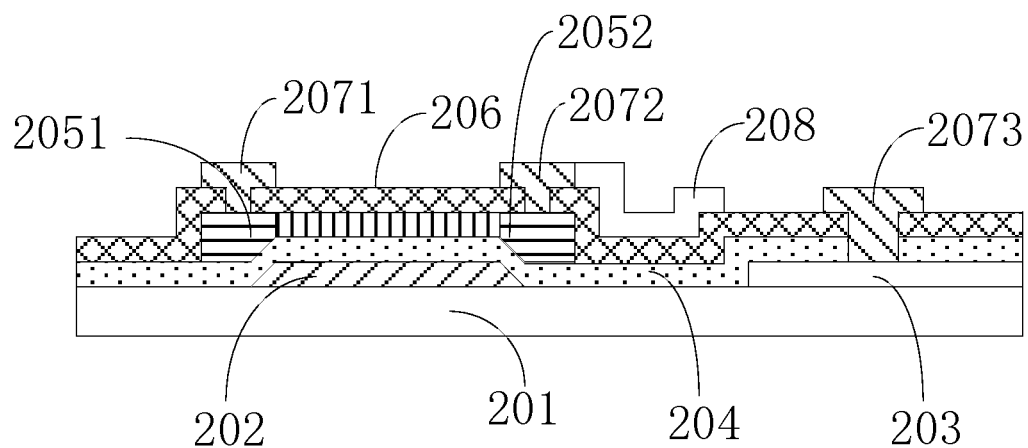
FIG. 18 is a schematic view of the array substrate in accordance with one embodiment.

FIG. 18 is a schematic view of the array substrate in accordance with one embodiment. The array substrate includes the substrate 201, and a first electrode layer, an insulation layer 204, a semiconductor layer, the dielectric layer 206, and a second electrode layer disposed on the substrate 201 in sequence.

The first electrode layer includes the gate electrode 202 and the first electrode 203. The second electrode includes the source electrode 2071, the drain electrode 2072, the second electrode 2073, and the transparent third electrode 208. The semiconductor layer respectively connects to the source electrode 2071 and the drain electrode 2072 via the first through hole and the second through hole being arranged on the dielectric layer 206 in accordance with the semiconductor layer. The third through hole is arranged on the dielectric layer 206 and the insulation layer 204 in accordance with the first electrode 203 such that the first electrode 203 connects with the second electrode 2073 to form the storage capacitor. The third electrode 208 connects with the drain electrode 2072 to form at least one pixel electrode.

The semiconductor layer is made by doping the poly-silicon so as to form a first doped area 2051 and a second doped area 2052. The first doped area 2051 and the second doped area 2052 connect to the source electrode 2071 and the drain electrode 2072 respectively via the first through hole and the second through hole.

The gate electrode 202 connects the gate lines.

The gate electrode 202, the source electrode 2071, the drain electrode 2072, and the second electrode 2073 are metallic electrodes.

The first electrode 203 and the third electrode 208 are ITO.

The array substrate may be the array substrates manufactured by the above manufacturing method.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

Figure 19:
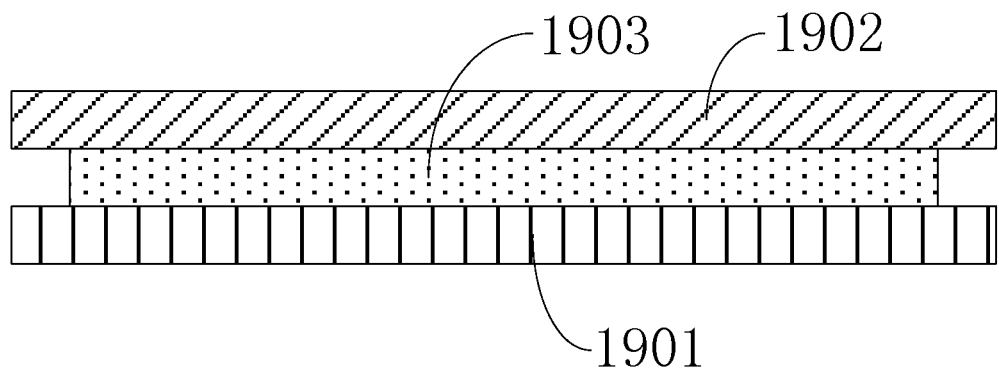
FIG. 19 is a schematic view of the display panel in accordance with one embodiment.

FIG. 19 is a schematic view of the display panel in accordance with one embodiment. The display panel includes a color film substrate 1091, an array substrate 1092, and a liquid crystal layer 1093 between the color film substrate 1091 and the array substrate 1092. The color film substrate 1091 may be one of the array substrate in the above embodiments.

Conventionally, when the first electrode is disposed on the semiconductor layer, an insulation layer with great thickness is needed so as to separate the first electrode and the source/drain electrode. In addition, when the third electrode is disposed on the first electrode, the insulation layer with great thickness is needed, which may results in a non-uniform display brightness. In the claimed invention, the first electrode is disposed on the substrate, which avoids the issues above. In addition, as the same mask may be used by the gate electrode and the first electrode, only six masks are needed during the manufacturing process. Comparing to the claimed invention, at least nine masks are needed in conventional manufacturing process. In view of the above, not only the manufacturing process is simplified, but also the cost is reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of array substrates, comprising:

forming a first electrode and a gate electrode on a substrate in sequence, a transparent conductive film is provided between the gate electrode and the substrate, and the transparent conductive film and the first electrode are formed within the same manufacturing step;

forming an insulation layer on the substrate, and the insulation layer covers the gate electrode and the first electrode;

forming a semiconductor layer on the insulation layer;

forming a dielectric layer on the semiconductor layer, and forming a first through hole and a second through hole in a location corresponding to the semiconductor layer such that a portion of the semiconductor layer are exposed via the first through hole and the second through hole, forming a third through hole in the location corresponding to the first electrode such that the first electrode is exposed via the third through hole;

forming a source electrode, a drain electrode and a second electrode on the dielectric layer, the source electrode and the drain electrode connect to the semiconductor layer respectively via the first through hole and the second through hole, and the second electrode connects to the first electrode via the third through hole to form a storage capacitor;

forming a transparent third electrode on the dielectric layer, and the third electrode connects with the drain electrode to form at least one pixel electrode;

wherein the gate electrode, the source electrode, the drain electrode, and the second electrode are metallic electrodes, and the first electrode and the third electrode are ITO;

wherein the step of forming the semiconductor layer on the insulation layer further comprises:

depositing an a-Si layer on the insulation layer to obtain poly-silicon;

covering a photoresist layer over the poly-silicon;
irradiating the substrate such that a portion of the photoresist layer that has not been blocked by the gate electrode is exposed;
etching the exposed portion of the photoresist layer and the poly-silicon; and
doping the poly-silicon to form a first doped area and a second doped area for respectively connecting the source electrode and the drain electrode, the first doped area corresponds to the first through hole and the second doped area corresponds to the second through hole.

2. The method as claimed in claim 1, wherein the step of forming the first electrode and the gate electrode further comprises:
forming a transparent first electrode layer on the substrate;
forming a gate electrode layer on the first electrode layer;
patterning the first electrode layer and the gate electrode layer so as to form a first island and a second island, and each of the islands comprises the first electrode layer and the gate electrode layer; and
etching the first island and the second island to respectively form the gate electrode and the first electrode.

3. An array substrate, comprising:
a substrate, and a first electrode layer, an insulation layer, a semiconductor layer, a dielectric layer, and a second electrode layer disposed on the substrate in sequence;
the first electrode layer comprises the gate electrode and the first electrode, a transparent conductive film is provided between the gate electrode and the substrate, and the transparent conductive film and the first electrode are formed within the same manufacturing step;
the second electrode layer includes a source electrode, a drain electrode, a second electrode, and a transparent third electrode;
the semiconductor layer respectively connects to the source electrode and the drain electrode via a first through hole and a second through hole being arranged on the dielectric layer in accordance with the semiconductor layer;
a third through hole being arranged on the dielectric layer and the insulation layer in accordance with the first electrode such that the first electrode connects with the second electrode to form a storage capacitor; and
the third electrode connects with the drain electrode to form at least one pixel electrode;
wherein the semiconductor layer is made by doping poly-silicon so as to form a first doped area and a second doped area; and
the first doped area and the second doped area connect to the source electrode and the drain electrode respectively via the first through hole and the second through hole.

4. The array substrate as claimed in claim 3, wherein the gate electrode, the source electrode, the drain electrode, and the second electrode are metallic electrodes.

5. The array substrate as claimed in claim 3, wherein the first electrode and the third electrode are ITO.

6. A display panel, comprising:
a color film substrate, an array substrate, and a liquid crystal layer between the color film substrate and the array substrate, wherein the array substrate comprises a substrate, and a first electrode layer, an insulation layer, a semiconductor layer, a dielectric layer, and a second electrode layer disposed on the substrate in sequence;
the first electrode layer comprises the gate electrode and the first electrode, a transparent conductive film is provided between the gate electrode and the substrate, and the transparent conductive film and the first electrode are formed within the same manufacturing step;
the second electrode layer includes a source electrode, a drain electrode, a second electrode, and a transparent third electrode;
the semiconductor layer respectively connects to the source electrode and the drain electrode via a first through hole and a second through hole being arranged on the dielectric layer in accordance with the semiconductor layer;
a third through hole being arranged on the dielectric layer and the insulation layer in accordance with the first electrode such that the first electrode connects with the second electrode to form a storage capacitor; and
the third electrode connects with the drain electrode to form at least one pixel electrode;
wherein the semiconductor layer is made by doping poly-silicon so as to form a first doped area and a second doped area; and
the first doped area and the second doped area connect to the source electrode and the drain electrode respectively via the first through hole and the second through hole.

7. The display panel as claimed in claim 6, wherein the gate electrode, the source electrode, the drain electrode, and the second electrode are metallic electrodes.

8. The display panel as claimed in claim 6, wherein the first electrode and the third electrode are ITO.

* * * * *